United States Patent
Zeng et al.

(10) Patent No.: US 12,543,489 B2
(45) Date of Patent: Feb. 3, 2026

(54) DISPLAY PANEL, DISPLAY MODULE, AND DISPLAY DEVICE

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Li Zeng, Beijing (CN); Qiang Tang, Beijing (CN); Xin Qing, Beijing (CN); Yang Shu, Beijing (CN); Xu Fan, Beijing (CN); Tianfu Wang, Beijing (CN); Jinglei Wang, Beijing (CN); Linhuan Yan, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 423 days.

(21) Appl. No.: 18/022,431

(22) PCT Filed: May 31, 2022

(86) PCT No.: PCT/CN2022/096118
§ 371 (c)(1),
(2) Date: Feb. 21, 2023

(87) PCT Pub. No.: WO2023/230803
PCT Pub. Date: Dec. 7, 2023

(65) Prior Publication Data
US 2024/0268212 A1    Aug. 8, 2024

(51) Int. Cl.
*H10K 77/10*  (2023.01)
*H05K 5/02*  (2006.01)
(Continued)

(52) U.S. Cl.
CPC ......... *H10K 77/111* (2023.02); *H05K 5/0217* (2013.01); *H10K 59/1201* (2023.02);
(Continued)

(58) Field of Classification Search
CPC ............. H10K 77/111; H10K 59/1201; H10K 59/875; H10K 2102/3023; H10K 2102/311; H05K 5/0217; G09F 9/30; G09F 9/33
See application file for complete search history.

(56) References Cited

U.S. PATENT DOCUMENTS

2021/0029838 A1* 1/2021 Lee ..................... B32B 3/04
2021/0366380 A1  11/2021 Zhu et al.
2025/0172970 A1* 5/2025 Park ..................... H10K 59/38

FOREIGN PATENT DOCUMENTS

CN    109559639 A    4/2019
CN    110212089 A    9/2019
(Continued)

*Primary Examiner* — J. E. Schoenholtz
(74) *Attorney, Agent, or Firm* — WHDA, LLP

(57) ABSTRACT

The present disclosure provides a display panel, comprising a display region, a binding region, and a bending region located between the display region and the binding region. A maximum bending angle of the bending region is less than 180°. The bending region includes a bending start point close to the display region, a distance between the bending start point and an apex of the bending region is less than a bending radius of the bending region in a first direction, and the first direction is a direction from the display region to the bending region. The present disclosure further provides a display module and a display device.

20 Claims, 3 Drawing Sheets

(51) Int. Cl.
*H10K 59/12* (2023.01)
*H10K 59/80* (2023.01)
*H10K 102/00* (2023.01)

(52) U.S. Cl.
CPC ... *H10K 59/875* (2023.02); *H10K 2102/3023* (2023.02); *H10K 2102/311* (2023.02)

(56) References Cited

FOREIGN PATENT DOCUMENTS

| | | | |
|---|---|---|---|
| CN | 110649039 | A | 1/2020 |
| CN | 112164309 | A | 1/2021 |
| CN | 112863347 | A | 5/2021 |
| CN | 112991945 | A | 6/2021 |
| CN | 113099730 | A | 7/2021 |
| CN | 113241341 | A | 8/2021 |
| CN | 113380852 | A | 9/2021 |
| CN | 113534516 | A | 10/2021 |
| CN | 113658509 | A | 11/2021 |
| CN | 114361126 | A | 4/2022 |

\* cited by examiner

DISPLAY PANEL, DISPLAY MODULE, AND DISPLAY DEVICE

CROSS-REFERENCE TO RELATED APPLICATION

This application is the U.S. national phase of PCT Application No. PCT/CN2022/096118 filed on May 31, 2022, the entire contents of which are hereby incorporated by reference.

TECHNICAL FIELD

The present disclosure relates to the manufacture of a display product, in particular to a display panel, a display module and a display device.

BACKGROUND

Narrow-frame display product has attracted more and more attentions, and in a flexible Organic Light-Emitting Diode (OLED) pad bending scheme, it is important to reduce a bending radius to achieve the narrow-frame product. For a laminated structure of an existing module, the bending radius is 0.2 mm, and when a smaller bending radius (e.g., 0.15 mm or 0.1 mm) needs to be provided, there are an extremely large risk as well as a process difficulty for the existing module.

SUMMARY

An object of the present disclosure is to provide a display panel, a display module and a display device, so as to achieve a narrow frame.

In one aspect, the present disclosure provides in some embodiments a display panel, including a display region, a binding region, and a bending region located between the display region and the binding region. A maximum bending angle of the bending region is less than 180°. The bending region includes a bending start point close to the display region, a distance between the bending start point and an apex of the bending region is less than a bending radius of the bending region in a first direction, and the first direction is a direction from the display region to the bending region.

In a possible embodiment of the present disclosure, the bending region includes a bending arc located between the bending start point and a bending end point, and the bending start point, a central point of the bending arc and the bending end point are not on a straight line.

In a possible embodiment of the present disclosure, a first support layer is arranged at a backlight side of the display region, the display region includes a first region corresponding to the first support layer and a second region adjacent to the first region in the first direction, the second region is arranged adjacent to the bending region, and the first direction is the direction from the display region to the bending region.

In a possible embodiment of the present disclosure, the display region includes an active display region and a wiring region located surrounding the active display region, the first region is the active display region, and the second region is located in the wiring region.

In a possible embodiment of the present disclosure, a ratio of a distance between the bending start point and the active display region to a length of the second region in the first direction is 1.5 to 3.

In a possible embodiment of the present disclosure, the binding region is located at the backlight side of the display panel, the binding region includes a third region and a fourth region arranged sequentially in the first direction, a support layer is arranged at a side of the third region close to the display region, and the fourth region is arranged adjacent to the bending region.

In a possible embodiment of the present disclosure, a ratio of a distance between the bending end point of the bending region and the binding region to a fourth region in the first direction is 1.5 to 3.

In another aspect, the present disclosure provides in some embodiments a display module including the above-mentioned display panel.

In a possible embodiment of the present disclosure, a first support layer is arranged at the backlight side of the display region, the display region includes a first region corresponding to the first support layer and a second region adjacent to the first region in the first direction, the second region is arranged adjacent to the bending region, and the first direction is a direction from the display region to the bending region. The binding region is located at a backlight side of the display panel, the binding region includes a third region and a fourth region arranged sequentially along the first direction, the second support layer is arranged at a side of the third region close to the display region, and the fourth region is arranged adjacent to the bending region. An orthogonal projection of the first region onto the binding region coincides with the third region, and an orthogonal projection of the second region onto the binding region coincides with the fourth region. A support structure is arranged between the second region and the fourth region, and the support structure includes a rigid support portion, and flexible support portions located at two opposite sides of the rigid support portion in a thickness direction of the display module.

In a possible embodiment of the present disclosure, a flexible support layer is arranged at an inner side of the bending region.

In a possible embodiment of the present disclosure, the flexible support layer is formed integrally with the flexible support portions.

In a possible embodiment of the present disclosure, the rigid support portion is made of metal or polyethylene terephthalate.

In a possible embodiment of the present disclosure, the flexible support portion is made of foam.

In a possible embodiment of the present disclosure, a first support layer is arranged at a backlight side of the display region, and the display region includes a first region corresponding to the first support layer and a second region adjacent to the first region in the first direction, the second region is arranged adjacent to the bending region, and the first direction is the direction from the display region to the bending region. The binding region is located at the backlight side of the display panel, the binding region includes a third region and a fourth region arranged sequentially along the first direction, the second support layer is arranged at a side of the third region close to the display region, and the fourth region is arranged adjacent to the bending region. An orthogonal projection of the first region onto the binding region coincides with the third region, and an orthogonal projection of the second region onto the binding region coincides with the fourth region. A shape-following support is filled between the second region and the fourth region, and a surface of the shape-following support close to the bending region is an arc surface adapted to a shape of the bending region.

In a possible embodiment of the present disclosure, the shape-following support is made of silicone.

In a possible embodiment of the present disclosure, a micro coating layer is arranged on the bending region, a polarizer is arranged at a light-exiting layer of the display panel, and one end of the micro coating layer is in contact with the polarizer.

The present disclosure has the following beneficial effects. The bending radius is less than 180°, and the distance between the bending start point and the apex of the bending region is less than the bending radius of the bending region in the first direction, i.e., a frame radius is less than the bending radius of the bending region. As a result, it is able to achieve a narrow frame without increasing the quantity of folds at the bending region.

DETAILED DESCRIPTION

Figure 1:
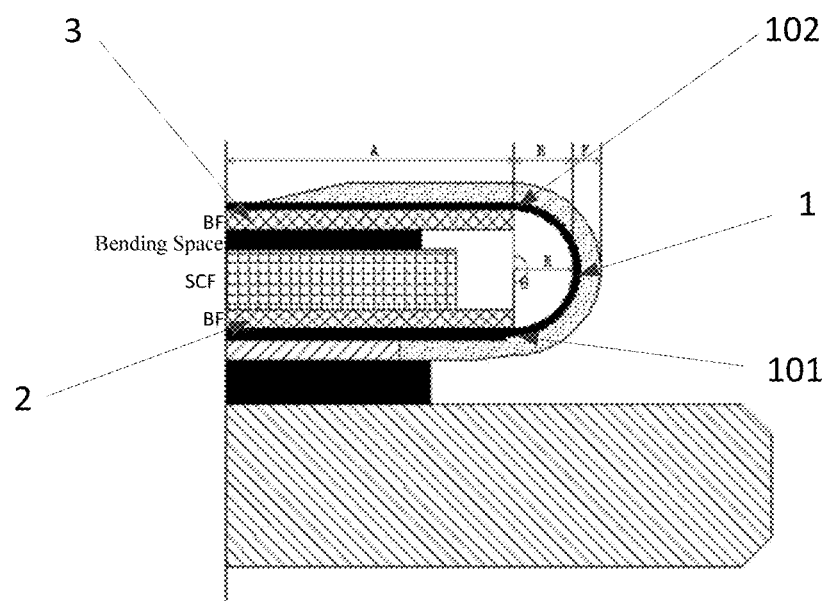
FIG. 1 is a schematic view showing a conventional display module.

In order to make the objects, the technical solutions and the advantages of the present disclosure more apparent, the present disclosure will be described hereinafter in a clear and complete manner in conjunction with the drawings and embodiments. Obviously, the following embodiments merely relate to a part of, rather than all of, the embodiments of the present disclosure, and based on these embodiments, a person skilled in the art may, without any creative effort, obtain the other embodiments, which also fall within the scope of the present disclosure.

In the embodiments of the present disclosure, it should be appreciated that, such words as "in the middle of", "on/above", "under/below", "left", "right", "vertical", "horizontal", "inside" and "outside" may be used to indicate directions or positions as viewed in the drawings, and they are merely used to facilitate the description in the present disclosure, rather than to indicate or imply that a device or member must be arranged or operated at a specific position. In addition, such words as "first", "second" and "third" may be merely used to differentiate different components rather than to indicate or imply any importance.

A display product with a narrow lower frame has attracted more and more attentions, and in a pad bending scheme specific for a flexible OLED display module, a bending radius is required to be smaller and smaller. In the related art, the bending radius is 0.2 mm to 0.25 mm. In order to meet the requirement on a narrow-frame product with an equal width at four sides, a bending radius R for a lower frame needs to be reduced to 0.1 mm. However, in order to provide the bending radius R of 0.1 mm, there exist the following problems in a conventional module.

1. If the bending radius R is reduced to 0.1 mm, a stress is applied to a bending region of a display panel, and thereby folds easily occur at the bending region. At this time, it is necessary to increase a thickness of a Micro Coating Layer (MCL). However, when the MCL is thickened, the bending region may be hardened, and when it is bent, a dead fold may easily occur. There is currently no scheme to solve this problem.

2. With reference to FIG. 1, if the bending radius R is 0.1 mm but a thickness of the bending region is only 0.2 mm, a thickness of a back film (BF)*2+a thickness of a Super Clean Film (SCF)+a thickness of a bending spacer needs to be 0.2 mm, and at this time, each film layer needs to be thinned. However, when the film layer is thinned, such inevitable risks as stress marks and a decrease in shock resistance may occur. There is currently no excellent scheme about the lamination of the module.

With reference to FIGS. 2 to 6, the present disclosure provides in some embodiments a display panel including a display region, a binding region, and a bending region 1 located between the display region and the binding region. A maximum bending angle of the bending region 1 is less than 180°. The bending region 1 includes a bending start point close to the display region, a distance between the bending start point and an apex 300 of the bending region is less than a bending radius of the bending region 1 in a first direction, and the first direction is a direction from the display region to the bending region 1.

Figure 2:
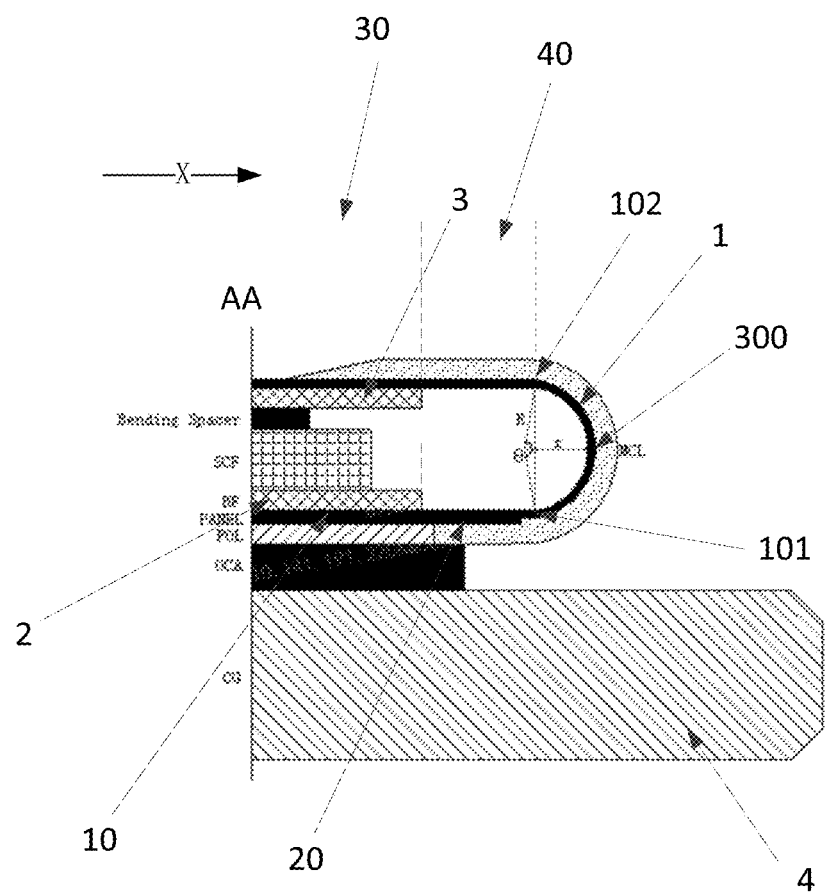
FIG. 2 is a schematic view showing a display module according to one embodiment of the present disclosure.

As shown in FIG. 2, in a bending state, from a side view of the display panel, the bending region has an arc-like shape, i.e., a bending arc. The bending arc includes the bending start point, and the bending start point is a point of a second region of the display panel close to the bending region. It should be appreciated that, on a plane parallel to the display panel, the bending start points form a straight line. Similarly, a bending end point refers to a point of the bending region close to the third region in a direction away from the display panel, and the bending end points form a straight line in the plane parallel to the display panel. A center of a circle with the bending radius R as a radius is located on a bending axis, and the center is a bending central point.

Illustratively, a bending arc is located between the bending start point and the bending end point of the bending region, and the bending start point, the bending end point and the bending central point of the bending region are not on a straight line. The bending angle is an angle between a line connecting the bending start point and the bending central point of the bending region and a line connecting the bending end point and the bending central point.

With reference to FIG. 2, in the embodiments of the present disclosure, a bending path is changed to achieve different bending states of the bending region 1, i.e., to enable the bending angle θ of the bending region 1 to be less than 180°. In this way, in the first direction, a distance r between the bending start point and the apex 300 of the bending region (the apex of the bending region is located on the bending axis of the bending region and is a point furthest away from the display region; it should be appreciated that, FIG. 2 is a side view of the display panel in a bending state, and the apex is a point FIG. 2; however, in actual use, the apex of the bending region refers to all points on a straight line parallel to the display panel; and a line connecting the apex 300 of the bending region and a central point of the bending region is vertical to a light-exiting direction of the display panel) is less than the bending radius R of the bending region 1. In the case of a large bending radius R of the bending region 1, it is able to provide a smaller actual bending width r (0.1 mm), thereby to provide a narrow lower frame without cracks.

In FIG. 1, a width D of the lower frame=A+R+F (A represents a distance from an active display region AA to the bending start point of the bending region 1, R represents the bending radius of the bending region 1, and F represents a sum of a thickness of a micro coating layer of the bending region 1 and a thickness of the display panel). The width D of the frame is reduced mainly through reducing the bending radius R. At present, the bending region 1 is bent by 180°, i.e., the bending angle of the bending region 1 is 180°. When R is reduced to 0.1 mm, the risk of bending cracks and folds of the display panel may increase dramatically. In addition, a height H (H=2R) of the bending region in a thickness direction of the display panel is only 0.2 mm, so an existing material lamination scheme is unsuitable. Referring to FIG. 2, in the embodiments of the present disclosure, the actual bending radius of the bending region 1 is R, but the bending angle θ of the bending region 1 is adjusted to be less than 180°, so as to enable a frame radius r (i.e., a distance between the bending start point and the apex 300 of the bending region in the first direction) to be less than R, thereby to reduce the width of the frame.

$$r = R\left(1 - \cos\frac{\theta}{2}\right),$$

and r=0.1 mm when θ=120° and R=0.2 mm. Hence, it is able to directly reduce the width of the narrow lower frame by R−r, without any necessity to reduce a thickness of each film layer at a backlight side of the display panel. As compared with the related art where the bending region is bent by 180 (as shown in FIG. 1), in the embodiments of the present disclosure, it is able to reduce a maximum bending stress at a center of the bending region 1 by more than 40%, thereby to remarkably reduce the risk of folds, and improve the reliability.

Various methods may be provided to enable the bending angle of the bending region to be less than 180°. For example, a first alignment mark is arranged at the display region, and a second alignment mark is arranged at the binding region. After the binding region has been bent to the backlight side of the display panel and the first alignment mark is aligned with the second alignment mark (i.e., an orthogonal projection of the first alignment mark onto the binding region coincides with the second alignment mark), the bending angle of the bending region is 180°, i.e., the bending region is of a semi-circular shape. In a possible embodiment of the present disclosure, in order to enable the bending angle of the bending region to be less than 180°, after the binding region has been bent to the backlight side of the display panel, the first alignment mark is not aligned with the second alignment mark, i.e., the orthogonal projection of the first alignment mark onto the binding region is located at a side of the second alignment mark close to the bending region. However, the present disclosure is not limited thereto.

Figure 7:
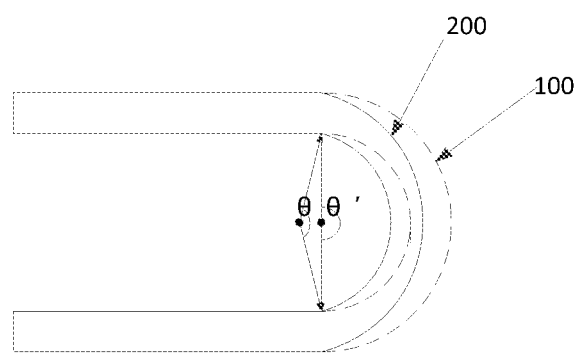
FIG. 7 is a schematic view showing the bending region in a bending state according to one embodiment of the present disclosure.

It should be appreciated that, the bending region has certain bending performance. In a possible embodiment of the present disclosure, when the first alignment mark is aligned with the second alignment mark, the bending region is deformed (for example, the bending apex is moved in a direction close to the display region). The bending angle of the bending region may also be smaller than 180° through changing a curvature of the bending region. Referring to FIG. 7, a dotted line 100 indicates a state where the bending angle θ' of the bending region is 180°, and a solid line 200 indicates a state where the bending angle θ of the bending region is smaller than 180°. As shown in FIG. 7, it is able to reduce the bending angle of the bending region merely through changing the curvature of the bending region, without any change in a distance between the display region and the binding region in the light-exiting direction of the display panel.

With reference to FIG. 1, in the related art, an end of a first back film (BF) 2 away from the display region is located at a start point 101 of the bending region 1. When this structure is still used, a starting region of the bending region 1 may press against the first back film 2, leading to an increase in the stress. In order to solve this problem, in the embodiments of the present disclosure, for example, a first support layer 2 is arranged at the backlight side of the display region, and the display region includes a first region 10 corresponding to the first support layer 2 and a second region 20 adjacent to the first region 10 in the first direction. The second region 20 is arranged adjacent to the bending region 1, and the first direction X is a direction from the display region to the bending region 1.

Based on the above, the first support layer 2 is depressed (i.e., the first back film in FIG. 1 is depressed). To be specific, an end of the first support layer 2 away from the display region is depressed in a direction close to the display region so as to form the second region 20 without any support layer. In this way, it is able to prevent the occurrence of an interference between the starting region of the bending region 1 and the first support layer 2.

A length of the second region 20 in the first direction may be set according to the practical need. Illustratively, the display region includes an active display region and a wiring region surrounding the active display region. The first region 10 is the active display region and the second region 20 is located in the wiring region.

Illustratively, a ratio of a distance between the bending start point and the active display region to the length of the second region in the first direction is, but not limited to, 1.5 to 3.

With reference to FIG. 1, in the related art, the end of the first back film 2 away from the display region is located at the bending end point 102 of the bending region 1. When this structure is still used, a bending tail end of the bending region 1 may press against the second back film 3, and the stress may increase. In order to solve this problem, for example, in the embodiments of the present disclosure, the binding region is located at the backlight side of the display panel, and the binding region includes a third region 30 and a fourth region 40 arranged sequentially in the first direction. A second support layer 3 is arranged at one side of the third region 30 close to the display region, and the fourth region 40 is arranged adjacent to the bending region 1.

Based on the above, the second support layer 3 is depressed (i.e., the second back film in FIG. 1 is depressed). To be specific, an end of the second support layer 3 away from the binding region is depressed in a direction close to the binding region so as to form the fourth region 40 without any support layer. In this way, it is able to prevent the occurrence of an interference between the bending end region of the bending region 1 and the second support layer 3.

Illustratively, a ratio of a distance between the bending end point of the bending region and the binding region to the fourth region in the first direction is, but is not limited to, 1.5 to 3.

The present disclosure further provides in some embodiments a display module including the above-mentioned display panel.

Figure 3:
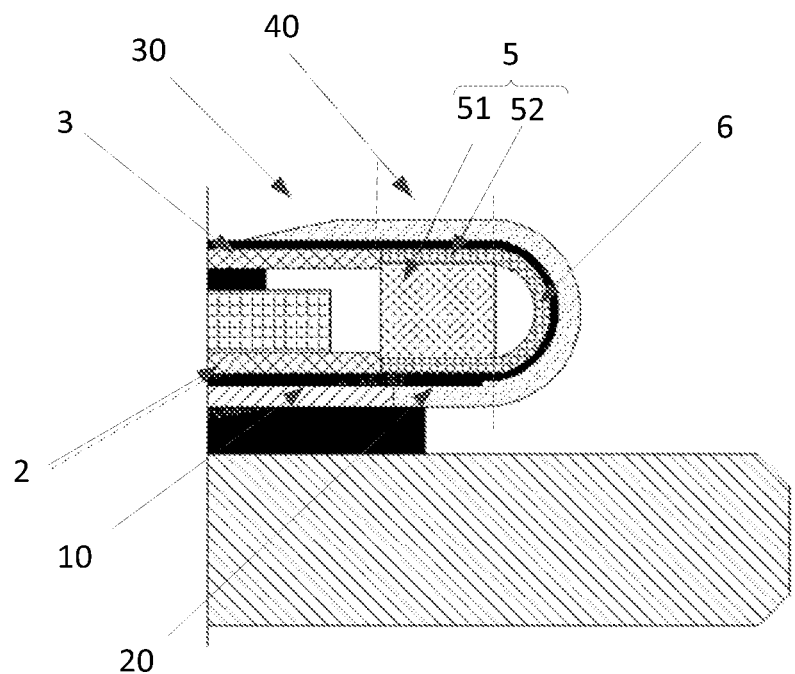
FIG. 3 is another schematic view showing the display module according to one embodiment of the present disclosure.

With reference to FIG. 3, illustratively, a first support layer 2 is arranged at a backlight side of a display region, and the display region includes a first region 10 corresponding to the first support layer 2 and a second region 20 adjacent to the first region 10 in the first direction. The second region 20 is arranged adjacent to the bending region 1, and the first direction is a direction from the display region to the bending region 1.

The binding region is located at the backlight side of the display panel, the binding region includes a third region 30 and a fourth region 40 arranged sequentially in the first direction, a second support layer 3 is arranged at one side of the third region 30 close to the display region, and the fourth region 40 is arranged adjacent to the bending region 1.

An orthogonal projection of the first region 10 onto the binding region coincides with the third region 30, and an orthogonal projection of the second region 20 onto the binding region coincides with the fourth region 40.

The support structure 5 is arranged between the second region 20 and the fourth region 40, the support structure 5 includes a rigid support portion 51 and a flexible support portions 52 at two opposite sides of the rigid support portion 51 in a thickness direction of the display module.

As shown in FIG. 1, one end of the first back film 2 corresponding to the display region away from the display region is located at the bending start point of the bending region 1, and one end of the second back film 3 corresponding to the binding region away from the display region is located at the bending end point of the bending region 1. For the display module in the embodiments of the present disclosure in a bending state, when the bending angle of the bending region is smaller than 180° and the scheme in FIG. 1 is still used, a corresponding portion of the bending region 1 may press against the support layer, and the stress may increase. When the end of the first back film 2 away from the display region in FIG. 1 is moved towards the display region and the end of the second back film 3 away from the display region is moved inwards, it is able to prevent the interference between the corresponding portion of the second region 20 and the support layer. However, neither the second region 20 nor the fourth region 40 is supported, and thereby the strength thereof is adversely affected. In the embodiments of the present disclosure, a support structure 5 is provided between the second region 20 and the fourth region 40, and the support structure 5 includes a rigid support portion 51 and flexible support portions 52 arranged at two opposite sides of the rigid support portion 51 in a thickness direction of the display module. Through the right support portion 51, it is able to improve the strength of the support structure 5, and through the flexible support portions 52, it is able to facilitate the bending of the bending region 1.

Referring to FIG. 3, illustratively, a flexible support layer 6 is arranged at an inner side of the bending region 1, so as to ensure the bending state of the bending region 1.

Illustratively, the flexible support layer 6 is formed integrally with the flexible support portions 52.

The flexible support layer 6 and the flexible support portions 52 may be integrally attached to a back surface of the bending region 1, so as to simplify the manufacture process.

Illustratively, the rigid support portion 51 is made of, but not limited to, metal or polyethylene terephthalate (PET), so as to ensure the support strength.

Illustratively, the flexible support portion 52 is made of foam, so as to ensure the bending state of the bending region 1, thereby to prevent an increase in the stress.

It should be appreciated that, the flexible support portion 52 is physically attached to the display panel without any adhesive, so as to facilitate the bending of the bending region 1 and ensure the bending state of the bending region 1.

Figure 4:
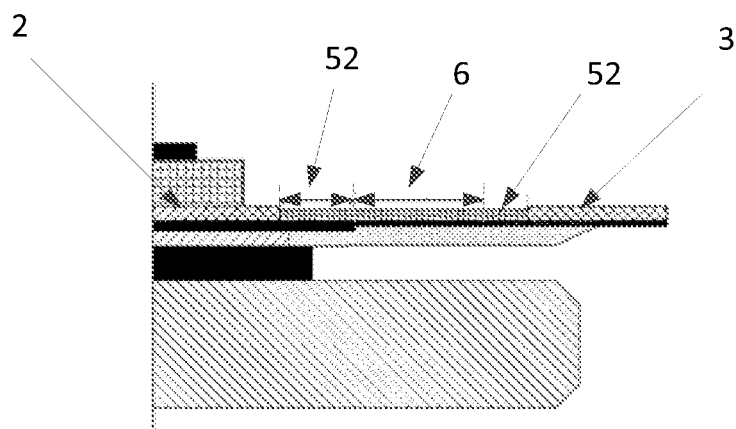
FIG. 4 is a schematic view showing the display module where a bending region is not bent and no rigid support portion is provided according to one embodiment of the present disclosure.
Figure 5:
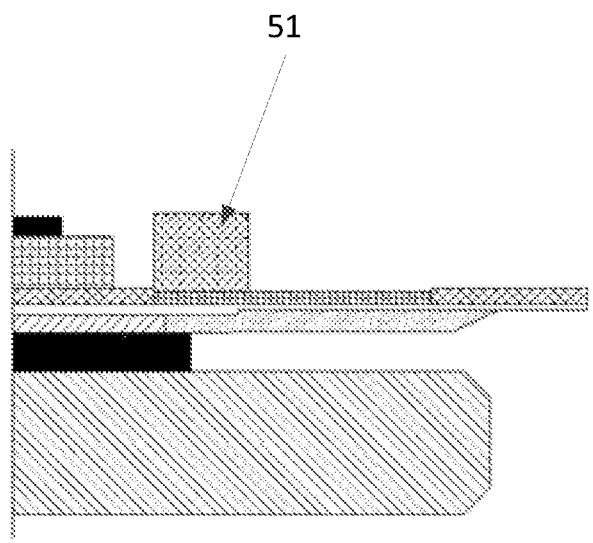
FIG. 5 is a schematic view showing the display module where the bending region is not bent and a rigid support portion is provided according to one embodiment of the present disclosure.

In a possible embodiment of the present disclosure, the flexible support layer 6 and the flexible support portions 52 form a one-piece flexible support structure. When the support structures are provided, the flexible support structures are attached to the display panel as shown in FIG. 4, then the rigid support portion is adhered to the flexible supports through an adhesive layer as shown in FIG. 5, and then the bending region is bent to enable the binding region to move to the backlight side of the display panel.

Illustratively, the first support layer 2 is arranged at the backlight side of the display region. In the first direction, the display region includes a first region 10 arranged corresponding to the first support layer 2 and a second region 20 adjacent to the first region 10, the second region 20 is arranged adjacent to the bending region 1, and the first direction is a direction from the display region to the bending region 1.

The binding region is located at the backlight side of the display panel, the binding region includes a third region 30 and a fourth region 40 arranged sequentially in the first direction, a second support layer 3 is arranged at a side of the third region 30 close to the display region, and the fourth region 40 is arranged adjacent to the bending region 1.

An orthogonal projection of the first region 10 onto the binding region coincides with the third region 30, and an orthogonal projection of the second region 20 onto the binding region coincides with the fourth region 40.

Figure 6:
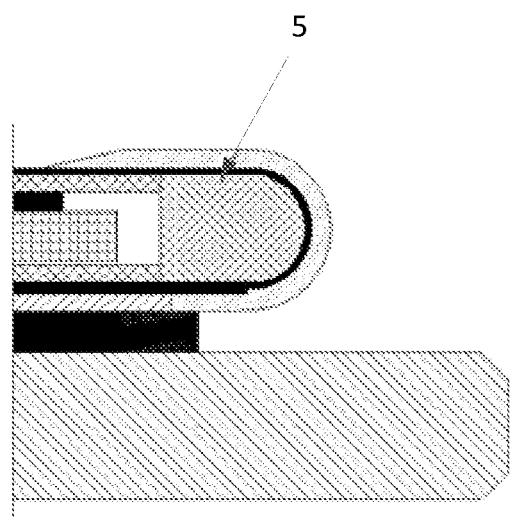
FIG. 6 is yet another schematic view showing the display module according to one embodiment of the present disclosure.

A shape-following support is filed between the second region 20 and the fourth region 40, and a surface of the shape-following support close to the bending region 1 is an arc surface adapted to a shape of the bending region 1, as shown in FIG. 6.

Illustratively, the shape-following support is made of silicone, so as to accurately control its bending state in an easier manner (the shape-following support is directly formed through an injection molding process).

Illustratively, the display module further includes a cover plate 4 at the light-exiting side of the display panel.

Illustratively, a polarizer is arranged at the light-exiting side of the display panel, and a micro coating layer in the bending region extends to be in contact with the polarizer.

Illustratively, an end of the micro coating layer adjacent to the binding region extends to, and covers, a part of the fourth region.

The cover plate 4 is located at a side of the polarizer away from the display panel, and the polarizer is coupled to the cover plate 4 via an optically clear adhesive (OCA). In the bending state, the first support layer 2, a heat clean film SCF, a bending spacer, and the second support layer 3 are arranged sequentially between the display region and the binding region of the display panel.

It should be appreciated that, the drawings in the embodiments of the present disclosure are for illustrative purposes only. In FIGS. 1 to 6, the display panel has an equal thickness, i.e., a thickness of the bending region is the same as a thickness of a non-bending region.

The present disclosure further provides in some embodiments a display device including the above-mentioned display module.

The display device may be any product or member having a display function, e.g., liquid crystal television, liquid crystal display, digital photo frame, mobile phone or tablet computer. The display device further includes a flexible circuit board, a printed circuit board and a back plate.

The above embodiments are for illustrative purposes only, but the present disclosure is not limited thereto. Obviously, a person skilled in the art may make further modifications and improvements without departing from the spirit of the present disclosure, and these modifications and improvements shall also fall within the scope of the present disclosure.

What is claimed is:

1. A display panel, comprising a display region, a binding region, and a bending region located between the display region and the binding region, wherein a maximum bending angle of the bending region is less than 180°, the bending region comprises a bending start point arranged at an end of the bending region close to the display region, a distance between the bending start point and an apex of the bending region is less than a bending radius of the bending region in a first direction, and the first direction is a direction from the display region to the bending region.

2. The display panel according to claim 1, wherein the bending region comprises a bending arc located between the bending start point and a bending end point, and the bending start point, a central point of the bending arc and the bending end point are not on a straight line.

3. The display panel according to claim 1, wherein a first support layer is arranged at a backlight side of the display region, the display region comprises a first region corresponding to the first support layer and a second region adjacent to the first region in the first direction, the second region is arranged adjacent to the bending region, and the first direction is the direction from the display region to the bending region.

4. The display panel according to claim 3, wherein the display region comprises an active display region and a wiring region located surrounding the active display region, the first region is the active display region, and the second region is located in the wiring region.

5. The display panel according to claim 3, wherein a ratio of a distance between the bending start point and the active display region to a length of the second region in the first direction is 1.5 to 3.

6. The display panel according to claim 1, wherein the binding region is located at the backlight side of the display panel, the binding region comprises a third region and a fourth region arranged sequentially in the first direction, a support layer is arranged at a side of the third region close to the display region, and the fourth region is arranged adjacent to the bending region.

7. The display panel according to claim 6, wherein a ratio of a distance between the bending end point of the bending region and the binding region to a fourth region in the first direction is 1.5 to 3.

8. A display module, comprising the display panel according to claim 1.

9. The display module according to claim 8, wherein a first support layer is arranged at the backlight side of the display region, the display region comprises a first region corresponding to the first support layer and a second region adjacent to the first region in the first direction, the second region is arranged adjacent to the bending region, and the first direction is a direction from the display region to the bending region;

the binding region is located at a backlight side of the display panel, the binding region comprises a third region and a fourth region arranged sequentially along the first direction, the second support layer is arranged at a side of the third region close to the display region, and the fourth region is arranged adjacent to the bending region;

an orthogonal projection of the first region onto the binding region coincides with the third region, and an orthogonal projection of the second region onto the binding region coincides with the fourth region; and a support structure is arranged between the second region and the fourth region, and the support structure comprises a rigid support portion, and flexible support portions located at two opposite sides of the rigid support portion in a thickness direction of the display module.

10. The display module according to claim 9, wherein a flexible support layer is arranged at an inner side of the bending region.

11. The display module according to claim 10, wherein the flexible support layer is formed integrally with the flexible support portions.

12. The display module according to claim 10, wherein the rigid support portion is made of metal or polyethylene terephthalate.

13. The display module according to claim 10, wherein the flexible support portion is made of foam.

14. The display module according to claim 9, wherein a first support layer is arranged at a backlight side of the display region, and the display region comprises a first region corresponding to the first support layer and a second region adjacent to the first region in the first direction, the second region is arranged adjacent to the bending region, and the first direction is the direction from the display region to the bending region;

the binding region is located at the backlight side of the display panel, the binding region comprises a third region and a fourth region arranged sequentially along the first direction, the second support layer is arranged at a side of the third region close to the display region, and the fourth region is arranged adjacent to the bending region;

an orthogonal projection of the first region onto the binding region coincides with the third region, and an orthogonal projection of the second region onto the binding region coincides with the fourth region; and a shape-following support is filled between the second region and the fourth region, and a surface of the shape-following support close to the bending region is an arc surface adapted to a shape of the bending region.

15. The display module according to claim 14, wherein the shape-following support is made of silicone.

16. The display module according to claim 8, wherein a micro coating layer is arranged on the bending region, a polarizer is arranged at a light-exiting layer of the display panel, and one end of the micro coating layer is in contact with the polarizer.

17. A display device, comprising the display module according to claim 9.

18. The display device according to claim 17, wherein a first support layer is arranged at the backlight side of the display region, the display region comprises a first region corresponding to the first support layer and a second region adjacent to the first region in the first direction, the second region is arranged adjacent to the bending region, and the first direction is a direction from the display region to the bending region;

the binding region is located at a backlight side of the display panel, the binding region comprises a third region and a fourth region arranged sequentially along the first direction, the second support layer is arranged at a side of the third region close to the display region, and the fourth region is arranged adjacent to the bending region;

an orthogonal projection of the first region onto the binding region coincides with the third region, and an orthogonal projection of the second region onto the binding region coincides with the fourth region; and a support structure is arranged between the second region and the fourth region, and the support structure comprises a rigid support portion, and flexible support portions located at two opposite sides of the rigid support portion in a thickness direction of the display module.

19. The display device according to claim 18, wherein a flexible support layer is arranged at an inner side of the bending region.

20. The display device according to claim 19, wherein the flexible support layer is formed integrally with the flexible support portions.

* * * * *